(12) United States Patent
Ray et al.

(10) Patent No.: US 9,583,460 B2
(45) Date of Patent: Feb. 28, 2017

(54) INTEGRATED DEVICE COMPRISING STACKED DIES ON REDISTRIBUTION LAYERS

(71) Applicant: QUALCOMM Incorporated, San Diego, CA (US)

(72) Inventors: Urmi Ray, Ramona, CA (US); Shiqun Gu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/181,371

(22) Filed: Feb. 14, 2014

(65) Prior Publication Data
US 2015/0235988 A1    Aug. 20, 2015

(51) Int. Cl.
H01L 25/065    (2006.01)
H01L 23/48     (2006.01)
H01L 21/48     (2006.01)
H01L 25/00     (2006.01)

(52) U.S. Cl.
CPC ........ *H01L 25/0652* (2013.01); *H01L 23/481* (2013.01); *H01L 25/50* (2013.01); *H01L 21/486* (2013.01); *H01L 2225/06524* (2013.01); *H01L 2225/06541* (2013.01)

(58) Field of Classification Search
CPC ................... H01L 23/02; H01L 25/162; H01L 2225/06541; H01L 2225/06513; H01L 2225/06517
See application file for complete search history.

(56) References Cited

U.S. PATENT DOCUMENTS

| 7,598,617 B2 | 10/2009 | Lee et al. |
| 8,546,955 B1 | 10/2013 | Wu |
| 2007/0126085 A1 | 6/2007 | Kawano et al. |
| 2011/0316146 A1 | 12/2011 | Pagaila et al. |
| 2012/0018885 A1 | 1/2012 | Lee et al. |

(Continued)

FOREIGN PATENT DOCUMENTS

JP    2013038300 A    2/2013

OTHER PUBLICATIONS

Partial International Search Report—PCT/US2015/015639—ISA/EPO—May 6, 2015.

(Continued)

*Primary Examiner* — Thanhha Pham
(74) *Attorney, Agent, or Firm* — Loza & Loza, LLP

(57) ABSTRACT

Some features pertain to an integrated device that includes a dielectric layer configured as a base for the integrated device, several redistribution metal layers in the dielectric layer, a first wafer level die coupled to a first surface of the dielectric layer, and a second wafer level die coupled to the first wafer level die. The dielectric layer includes several dielectric layers. In some implementations, the first wafer level die is coupled to the redistribution metal layers through a first set of interconnects. In some implementations, the first wafer level die includes several through substrate vias (TSVs). In some implementations, the second wafer level die is coupled to the redistribution metal layers through a first set of interconnects, the TSVs, a second set of interconnects, and a set of solder balls. In some implementations, the integrated device includes an encapsulation layer that encapsulates the first and second wafer level dies.

14 Claims, 16 Drawing Sheets

(56) References Cited

U.S. PATENT DOCUMENTS

| | | |
|---|---|---|
| 2012/0280405 A1 | 11/2012 | Hwang et al. |
| 2013/0032947 A1 | 2/2013 | Park et al. |
| 2014/0070422 A1* | 3/2014 | Hsiao et al. ................. 257/774 |
| 2014/0185264 A1* | 7/2014 | Chen et al. ................... 361/814 |
| 2015/0171034 A1* | 6/2015 | Yu .......................... H01L 24/02 257/777 |

OTHER PUBLICATIONS

International Search Report and Written Opinion—PCT/US2015/015639—ISA/EPO—Aug. 20, 2015.

\* cited by examiner

INTEGRATED DEVICE COMPRISING STACKED DIES ON REDISTRIBUTION LAYERS

BACKGROUND

Field

Various features relate to an integrated device that includes stacked dies on redistributions layers.

Background

FIG. 1 illustrates a conventional integrated package 100 that includes a substrate 102, a first die 106, a second die 108, a first set of solder balls 116, a second set of solder balls 118, and a third set of solder balls 120. The first die 106 is coupled to the substrate 102 through the first set of solder balls 116. The second die 108 is coupled to the substrate 102 through the second set of solder balls 118. The third set of solder balls 120 is coupled to the substrate 102. Typically, the third set of solder balls 120 is coupled to a printed circuit board (PCB) (not shown).

Conventional integrated packages, such as the one described in FIG. 1, have certain limitations and downsides. For example, the substrate 102 of the integrated package 100 of FIG. 1 is typically made of an organic laminate (e.g., rigid or flexible), or a silicon (Si) interposer. The use of such materials as a substrate creates design problems when attempting to manufacture low profile integrated package. That is, these materials create substantial design penalty due to their manufacturing limitations. In particular, these materials make it impossible or cost-prohibitive to provide a low profile integrated package that includes multiple dies, where the integrated package takes up as little real estate as possible.

Moreover, the use of solder balls as a coupling method between a die and a substrate limits the density of the connection that can exist between a die and a substrate, as the minimum spacing required between solder balls is often greater than the minimum spacing required between traces and/or vias on a substrate.

Therefore, there is a need for a cost effective integrated package that has a low profile but also takes up a little real estate as possible. Ideally, such an integrated package will also provide higher density connections with the dies.

SUMMARY

Various features, apparatus and methods described herein provide an integrated device that includes stacked dies on redistributions layers.

A first example provides an integrated device that includes a dielectric layer configured as a base for the integrated device, several redistribution metal layers in the dielectric layer, a first wafer level die coupled to a first surface of the dielectric layer, and a second wafer level die coupled to the first wafer level die.

According to an aspect, the dielectric layer includes several dielectric layers.

According to one aspect, the first wafer level die is coupled to several redistribution metal layers through a first set of interconnects.

According to an aspect, the second wafer level die is coupled to the first wafer level die through a set of interconnects, and a set of solder balls.

According to one aspect, the first wafer level die includes several through substrate vias (TSVs). In some implementations, the second wafer level die is coupled to several redistribution metal layers through a first set of interconnects, several TSVs, a second set of interconnects, and a set of solder balls.

According to an aspect, the integrated device includes an encapsulation layer that encapsulates the first wafer level die and the second wafer level die.

According to one aspect, the integrated device includes a third wafer level die coupled to the first surface of the dielectric layer.

According to an aspect, the first wafer level die is a processor and the second wafer level die is a memory die.

According to one aspect, the integrated device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A second example provides an apparatus that includes a dielectric layer configured as a base for the integrated device, a redistribution interconnect means in the dielectric layer, a first wafer level die coupled to a first surface of the dielectric layer, and a second wafer level die coupled to the first wafer level die.

According to an aspect, the dielectric layer includes several dielectric layers.

According to one aspect, the first wafer level die is coupled to the redistribution interconnect means through a first set of interconnects.

According to an aspect, the second wafer level die is coupled to the first wafer level die through a set of interconnects, and a set of solder balls.

According to one aspect, the first wafer level die comprises a plurality of through substrate vias (TSVs). In some implementations, the second wafer level die is coupled to the redistribution interconnect means through a first set of interconnects, several TSVs, a second set of interconnects, and a set of solder balls.

According to an aspect, the apparatus includes an encapsulation layer that encapsulates the first wafer level die and the second wafer level die.

According to one aspect, the apparatus includes a third wafer level die coupled to the first surface of the dielectric layer.

According to an aspect, the first wafer level die is a processor and the second wafer level die is a memory die.

According to one aspect, the apparatus is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

A third example provides a method for fabricating an integrated device. The method places a first wafer level die on a carrier. The method places a second wafer level die on the first wafer level die. The method encapsulates the first and second wafer level dies with an encapsulation layer. The method forms a dielectric layer on a first surface of the encapsulated first and second wafer level dies, where the first surface is opposite of the carrier. The method forms a plurality of redistribution metal layers in the dielectric layer.

According to an aspect, forming the dielectric layer includes forming several dielectric layers on the surface of the encapsulated first and second wafer level dies.

According to one aspect, forming several redistribution metal layers includes coupling several redistribution metal layers to a first set of interconnects of the first wafer level die.

According to an aspect, placing the second wafer level die to the first wafer level die includes coupling a set of interconnects and a set of solder balls to the first wafer level die.

According to one aspect, the first wafer level die includes several through substrate vias (TSVs).

According to an aspect, placing a first wafer level die on a carrier includes placing the first wafer level die on an adhesive layer of the carrier. In some implementations, the method also includes removing at least one of the carrier and/or the adhesive layer.

According to one aspect, the method further includes removing at least part of the carrier.

According to an aspect, the first wafer level die is a processor and the second wafer level die is a memory die.

According to one aspect, the integrated device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Overview

Some novel features pertain to an integrated device (e.g., integrated package, wafer level integrated package device) that includes a dielectric layer configured as a base for the integrated device, several redistribution metal layers in the dielectric layer, a first die coupled to a first surface of the dielectric layer, and a second die coupled to the first die. In some implementations, the dielectric layer includes several dielectric layers. In some implementations, the first die is coupled to the redistribution metal layers through a first set of interconnects. In some implementations, the second die is coupled to the first die through a set of interconnects, and a set of solder balls. In some implementations, the first die includes several through substrate vias (TSVs). In some implementations, the second die is coupled to the redistribution metal layers through the first set of interconnects, the TSVs, the second set of interconnects, and the set of solder balls. In some implementations, the integrated device further includes an encapsulation material that encapsulates the first die and the second die. In some implementations, the integrated device further includes a third die coupled to the first surface of the dielectric layer. In some implementations, the first die is a processor and the second die is a memory die.

Exemplary Integrated Device that Includes Stacked Dies

Figure 1:
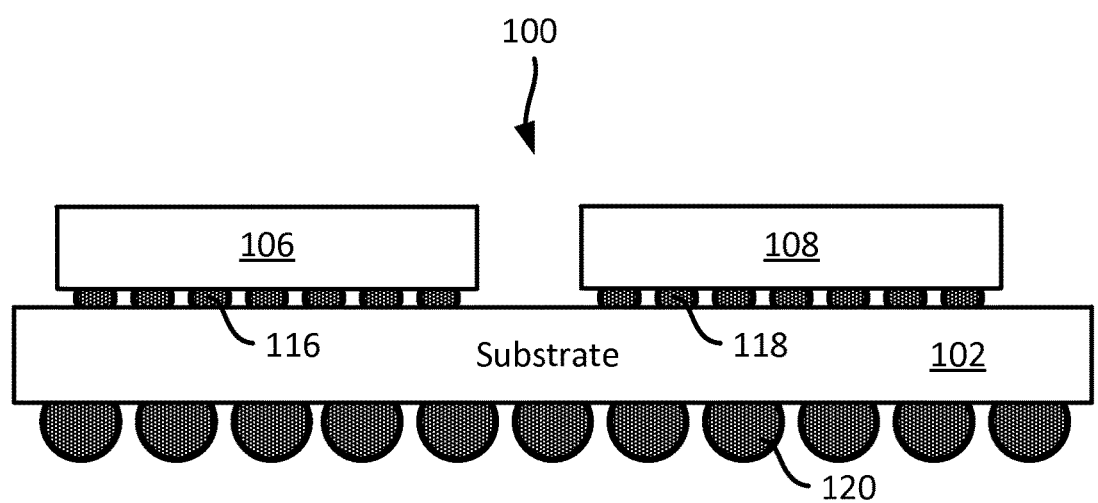
FIG. 1 illustrates a profile view of a conventional integrated device.
Figure 2:
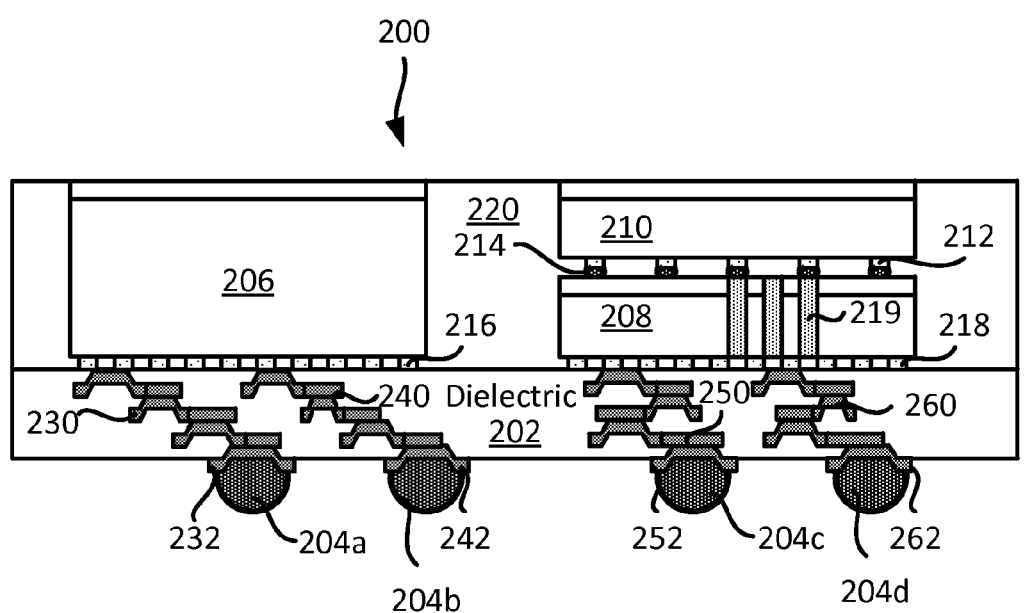
FIG. 2 illustrates an example of an integrated device that includes stacked dies.

FIG. 2 conceptually illustrates an example of a side view of an integrated device (e.g., semiconductor device, integrated package, wafer level integrated package device) that includes stacked dies. Specifically, FIG. 2 illustrates an integrated device 200 (e.g., integrated package) that includes a dielectric layer 202, a first set of solder balls 204 (e.g., 204a-204d), a first die 206, a second die 208, a third die 210, and an encapsulation material 220. Different implementations may use different materials for the encapsulation material 220. For example, the encapsulation material 220 may include one of at least a mold, an epoxy and/or a polymer fill. The dies (e.g., first die 206, second die 208, third die 210) may represent different types of dies, such as memory dies, and/or processors. Dies are further described in detail below with reference to FIGS. 3-4.

The dielectric layer 202 may include one dielectric layer or several dielectric layers. In some implementations, the dielectric layer 202 is an insulation layer. In some implementations, the total thickness of the dielectric layer 202 is 100 microns (μm) or less. Different implementations may use different materials for the dielectric layer 202. In some implementations, the dielectric layer 202 may include one of at least polyimide, phenolic resin, Polybenzoxazole (PbO) layer and/or a polymer.

FIG. 2 illustrates that the dielectric layer 202 includes a set of metal layers. In particular, the dielectric layer 202 includes a first set of redistribution interconnects 230, a first under bump (UBM) layer 232, a second set of redistribution interconnects 240, a second under bump (UBM) layer 242, a third set of redistribution interconnects 250, a third under bump (UBM) layer 252, a fourth set of redistribution interconnects 260, and a fourth under bump (UBM) layer 262. In some implementations, the first, second, third, and fourth redistribution interconnects 230, 240, 250, and 260 are redistribution layers. The redistribution layers may include vias. Different implementations may have different number of redistribution metal layers (e.g., 1, 2 or more metal layers).

The first die 206 is coupled to a first surface of the dielectric layer 202 through a first set of interconnects 216. In some implementations, the first set of interconnects 216 are metal pillars (e.g., metal layers). In some implementations, the metal pillars are copper pillars. In some implementations, the first die 206 is electrically coupled to at least one of the set of solder balls 204 through the first set of interconnects 216, the first set of redistribution interconnects 230, the first UBM layer 232, the second set of redistribution interconnects 240, and/or the second UBM layer 242. In some implementations, the UBM layers are optional. In such instances, the solder balls may be coupled to the set of redistribution interconnects (e.g., redistribution interconnects 230, 240, 250, 260).

The second die 208 is coupled to the first surface of the dielectric layer 202 through a second set of interconnects 218. In some implementations, the second set of interconnects 218 are metal pillars (e.g., metal layers). In some implementations, the metal pillars are copper pillars. In some implementations, the second die 208 is electrically coupled to at least one of the set of solder balls 204 through the second set of interconnects 218, the third set of redistribution interconnects 250, and/or the third UBM layer 252. In some implementations, the first die 208 may be electrically coupled to the second die 210 through a set of redistribution interconnects in the dielectric layer 202.

The third die 210 is coupled to the second die 208 through a third set of interconnects 212 and a set of solder balls 214. In some implementations, the third set of interconnects 212 and the set of solder balls 214 form a set of interconnect bumps.

As shown in FIG. 2, the second die 208 includes a set of through substrate vias (TSVs) 219. The TSVs 219 may traverse part of the second die 208 or may traverse the entire second die 208. In some implementations, the third die 210 is electrically coupled to at least one of the solder balls 204 through the third set of interconnects 212, the set of solder balls 214, the TSVs 219, the second set of interconnects 218, the fourth set of redistribution interconnects 260, and/or the fourth UBM layer 262.

Figure 3:
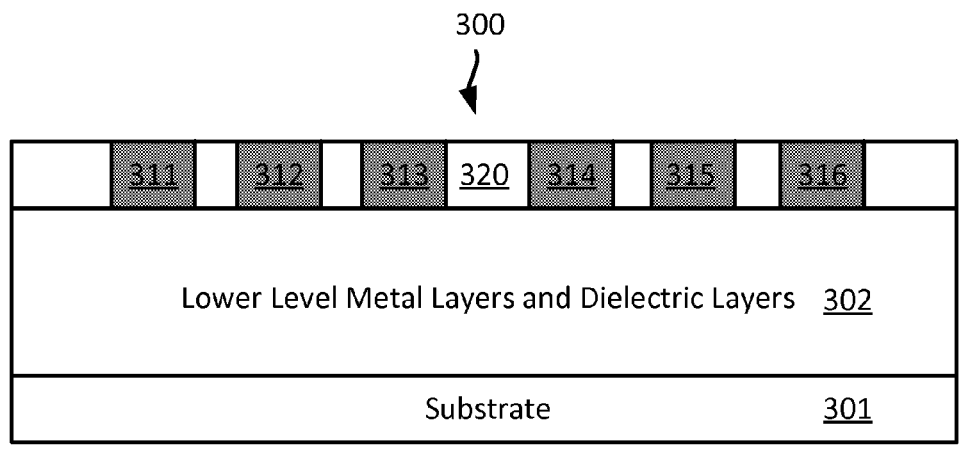
FIG. 3 illustrates an example of a die.

FIG. 3 conceptually illustrates an example of a die 300 (which is a form of an integrated device). For purpose of clarity, FIG. 3 illustrates a generalization of a die. As such, not all the components of a die are necessarily shown in FIG. 3. In some implementations, the die 300 may correspond to at least one of the dies 206, 208, and/or 210 of FIG. 2. In some implementations, the die 300 is a wafer level die. In some implementations, the die 300 is a die package. As shown in FIG. 3, the die 300 (e.g., integrated device) includes a substrate 301, several lower level metal layers and dielectric layers 302, a set of interconnects 311-316 (e.g., bumps, pillar interconnects), and an encapsulation material 320 (e.g., mold, epoxy, polymer fill). In some implementations, the encapsulation material 320 may be optional. The die 300 includes an active region (e.g., front side) and a back side region.

In some implementations, the die 300 may also include pads, a passivation layer, a first insulation layer, and/or a first pad layer. In such instances, the pad may be coupled to the lower level metal layers and dielectric layers 302. A passivation layer may be positioned between the lower level metal layers and dielectric layers 302 and the encapsulation material 320. A first pad layer may be coupled to the pad and one of the interconnects 311-316.

Figure 4:
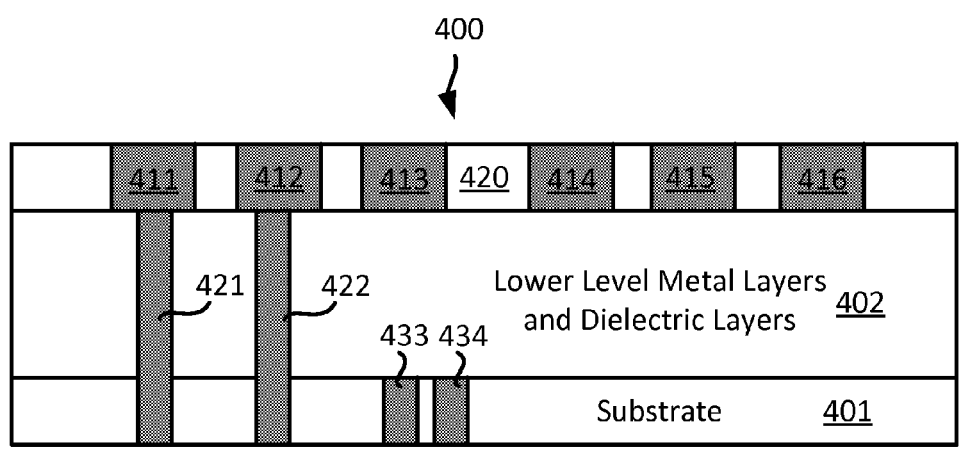
FIG. 4 illustrates an example of a die that includes a through substrate via.

In some implementations, a die may also include one or more through substrate vias (TSVs). FIG. 3 conceptually illustrates an example of a die 400 (which is a form of an integrated device) that includes at least one TSV. For purpose of clarity, FIG. 4 illustrates a generalization of a die. As such, not all the components of a die are necessarily shown in FIG. 4. In some implementations, the die 400 may correspond to at least one of the dies 206, 208, and/or 210 of FIG. 2. In some implementations, the die 400 is a wafer level die. In some implementations, the die 400 is a die package. As shown in FIG. 4, the die 400 (e.g., integrated device) includes a substrate 401, several lower level metal layers and dielectric layers 402, a set of interconnects 411-416 (e.g., bumps, pillar interconnects, pads), and an encapsulation material 420 (e.g., mold, epoxy, polymer fill, inorganic dielectrics). In some implementations, the encapsulation material 420 may be optional. The die 400 includes an active region (e.g., front side) and a back side region.

As shown in FIG. 4, the die 400 includes a first through substrate via (TSV) 421, a second TSV 422, a third TSV 423, and a fourth TSV 424. The first TSV 421 and the second TSV 422 traverse the substrate 401 and the lower level metal layers and dielectric layers 402. The third TSV 433 and the fourth TSV 434 traverse the substrate 401.

In some implementations, the die 400 may also include pads, a passivation layer, a first insulation layer, a first under bump metallization (UBM) layer, and a second under bump metallization (UBM) layer. In such instances, the pad may be coupled to the lower level metal layers and dielectric layers 402. A passivation layer may be positioned between the lower level metal layers and dielectric layers 402 and the encapsulation material 420. A first bump layer may be coupled to the pad and one of the interconnects 411-416.

Figure 5:
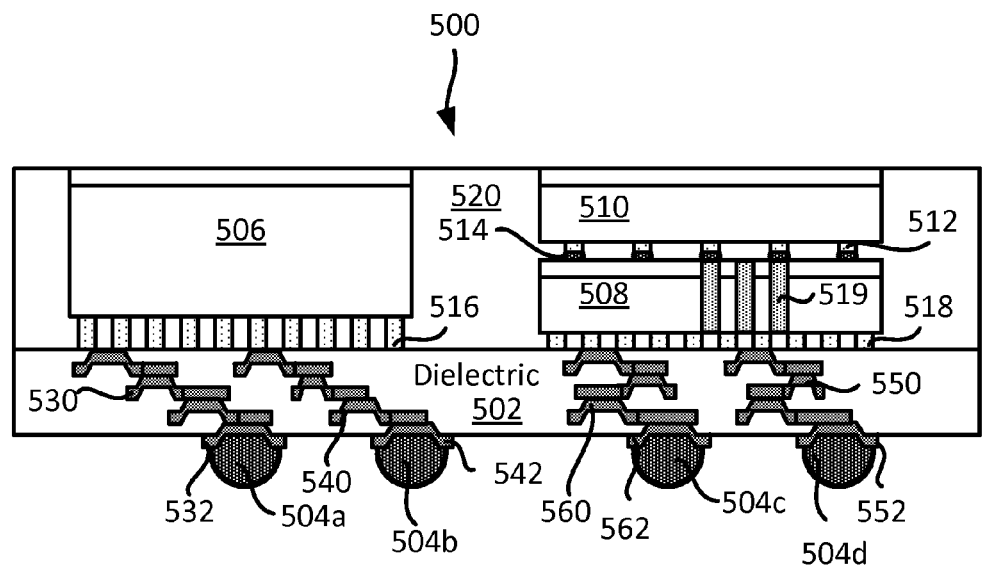
FIG. 5 illustrates an example of an integrated device that includes stacked dies.
Figure 6:
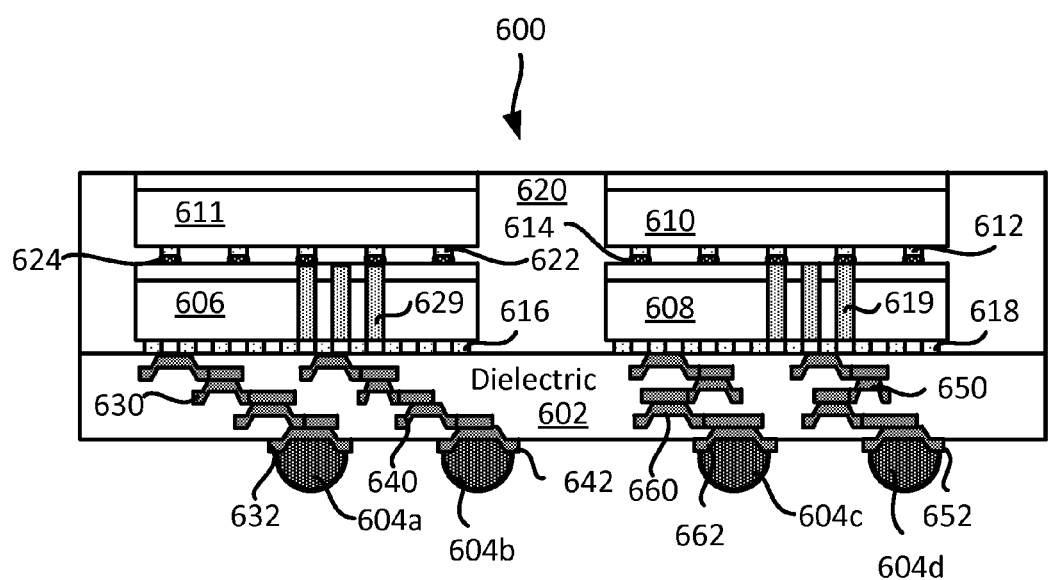
FIG. 6 illustrates an example of an integrated device that includes stacked dies.

Different implementations of an integrated device may have different combinations and/or configurations of dies. FIGS. 5-6 conceptually illustrate other integrated devices.

Specifically, FIG. 5 illustrates an integrated device 500 (e.g., integrated package) that includes a dielectric layer 502, a first set of solder balls 504 (e.g., 504a-504d), a first die 506, a second die 508, a third die 510, and an encapsulation material 520. Different implementations may use different materials for the encapsulation material 520. For example, the encapsulation material 520 may include one of at least a mold, an epoxy and/or a polymer fill. The dies (e.g., first die 506, second die 508, third die 510) may represent different types of dies, such as memory dies, and/or processors. Dies were described in detail with reference to FIGS. 3-4.

The dielectric layer 502 may include one dielectric layer or several dielectric layers. In some implementations, the dielectric layer 502 is an insulation layer. FIG. 5 illustrates that the dielectric layer 502 includes a set of metal layers. In particular, the dielectric layer 502 includes a first set of redistribution interconnects 530, a first under bump (UBM) layer 532, a second set of redistribution interconnects 540, a second under bump (UBM) layer 542, a third set of redistribution interconnects 550, a third under bump (UBM)

layer 552, a fourth set of redistribution interconnects 560, and a fourth under bump (UBM) layer 562. In some implementations, the first, second, third, and fourth redistribution interconnects 530, 540, 550, and 560 are redistribution layers. The redistribution layers may include vias. Different implementations may have different number of redistribution metal layers (e.g., 1, 2 or more metal layers).

The first die 506 is coupled to a first surface of the dielectric layer 502 through a first set of interconnects 516. In some implementations, the first set of interconnects 516 are metal pillars (e.g., metal layers). In some implementations, the metal pillars are copper pillars. In some implementations, the first die 506 is electrically coupled to at least one of the set of solder balls 504 through the first set of interconnects 516, the first set of redistribution interconnects 530, the first UBM layer 532, the second set of redistribution interconnects 540, and/or the second UBM layer 542.

The second die 508 is coupled to the first surface of the dielectric layer 502 through a second set of interconnects 518. In some implementations, the second set of interconnects 518 are metal pillars (e.g., metal layers). In some implementations, the metal pillars are copper pillars. In some implementations, the second die 508 is electrically coupled to at least one of the set of solder balls 504 through the second set of interconnects 518, the third set of redistribution interconnects 550, and/or the third UBM layer 552.

As shown in FIG. 5, the first set of interconnects 516 is longer than the second set of interconnects 518. In some implementations, this is done in order to have the height of the first die 506 to be substantially similar to the combine height of the second die 508 and the third die 510. The length of the first set of interconnects 516 may be different for different implementations.

The third die 510 is coupled to the second die 508 through a third set of interconnects 512 and a set of solder balls 514. In some implementations, the third set of interconnects 512 and the set of solder balls 514 form a set of interconnect bumps.

As shown in FIG. 5, the second die 508 includes a set of through substrate vias (TSVs) 519. The TSVs 519 may traverse part of the second die 508 or may traverse the entire second die 508. In some implementations, the third die 510 is electrically coupled to at least one of the solder balls 504 through the third set of interconnects 512, the set of solder balls 514, the TSVs 519, the second set of interconnects 518, the fourth set of redistribution interconnects 560, and/or the fourth UBM layer 562. In some implementations, the UBM layers are optional. In such instances, the solder balls may be coupled to the set of redistribution interconnects.

FIG. 6 illustrates an integrated device 600 (e.g., integrated package) that includes a dielectric layer 602, a first set of solder balls 604 (e.g., 604a-604d), a first die 606, a second die 608, a third die 610, a fourth die 611 and an encapsulation material 620. Different implementations may use different materials for the encapsulation material 620. For example, the encapsulation material 620 may include one of at least a mold, an epoxy and/or a polymer fill. The dies (e.g., first die 606, second die 608, third die 610, fourth die 611) may represent different types of dies, such as memory dies, and/or processors. Dies were described in detail with reference to FIGS. 3-4.

The dielectric layer 602 may include one dielectric layer or several dielectric layers. In some implementations, the dielectric layer 602 is an insulation layer. FIG. 6 illustrates that the dielectric layer 602 includes a set of metal layers. In particular, the dielectric layer 602 includes a first set of redistribution interconnects 630, a first under bump (UBM) layer 632, a second set of redistribution interconnects 640, a second under bump (UBM) layer 642, a third set of redistribution interconnects 650, a third under bump (UBM) layer 652, a fourth set of redistribution interconnects 660, and a fourth under bump (UBM) layer 662. In some implementations, the first, second, third, and fourth redistribution interconnects 630, 640, 650, and 660 are redistribution layers. The redistribution layers may include vias. Different implementations may have different number of redistribution metal layers (e.g., 1, 2 or more metal layers). The set of solder balls 604 are coupled to the UBM layers 632, 642, 652, and/or 662. However, in some implementations, the UBM layers 632, 642, 652, and/or 662 are optional. In such instances, the set of solder balls 604 may be coupled to the set of redistribution interconnects 630, 640, 650, and/or 660.

The first die 606 is coupled to a first surface of the dielectric layer 602 through a first set of interconnects 616. In some implementations, the first set of interconnects 616 are metal pillars (e.g., metal layers). In some implementations, the metal pillars are copper pillars. In some implementations, the first die 606 is electrically coupled to at least one of the set of solder balls 604 through the first set of interconnects 616, the first set of redistribution interconnects 630, and/or the first UBM layer 632.

The fourth die 611 is coupled to the first die 606 through a fourth set of interconnects 622 and a set of solder balls 624. In some implementations, the fourth set of interconnects 622 and the set of solder balls 624 form a set of interconnect bumps.

As shown in FIG. 6, the first die 606 includes a set of through substrate vias (TSVs) 629. The TSVs 629 may traverse part of the first die 606 or may traverse the entire first die 606. In some implementations, the fourth die 611 is electrically coupled to at least one of the solder balls 604 through the fourth set of interconnects 622, the set of solder balls 624, the TSVs 629, the first set of interconnects 616, the second set of redistribution interconnects 640, and/or the second UBM layer 642.

The second die 608 is coupled to the first surface of the dielectric layer 602 through a second set of interconnects 618. In some implementations, the second set of interconnects 618 are metal pillars (e.g., metal layers). In some implementations, the metal pillars are copper pillars. In some implementations, the second die 608 is electrically coupled to at least one of the set of solder balls 604 through the second set of interconnects 618, the third set of redistribution interconnects 650, and/or the third UBM layer 652.

The third die 610 is coupled to the second die 608 through the third set of interconnects 612 and a set of solder balls 614. In some implementations, the third set of interconnects 612 and the set of solder balls 614 form a set of interconnect bumps.

As shown in FIG. 6, the second die 608 includes a set of through substrate vias (TSVs) 619. The TSVs 619 may traverse part of the second die 608 or may traverse the entire second die 608. In some implementations, the third die 610 is electrically coupled to at least one of the solder balls 604 through the third set of interconnects 612, the set of solder balls 614, the TSVs 619, the second set of interconnects 618, the fourth set of redistribution interconnects 660, and/or the fourth UBM layer 662.

Having described several integrated devices, a sequence for providing/manufacturing an integrated device (e.g., semiconductor device) will now be described below.

Figure 7A:
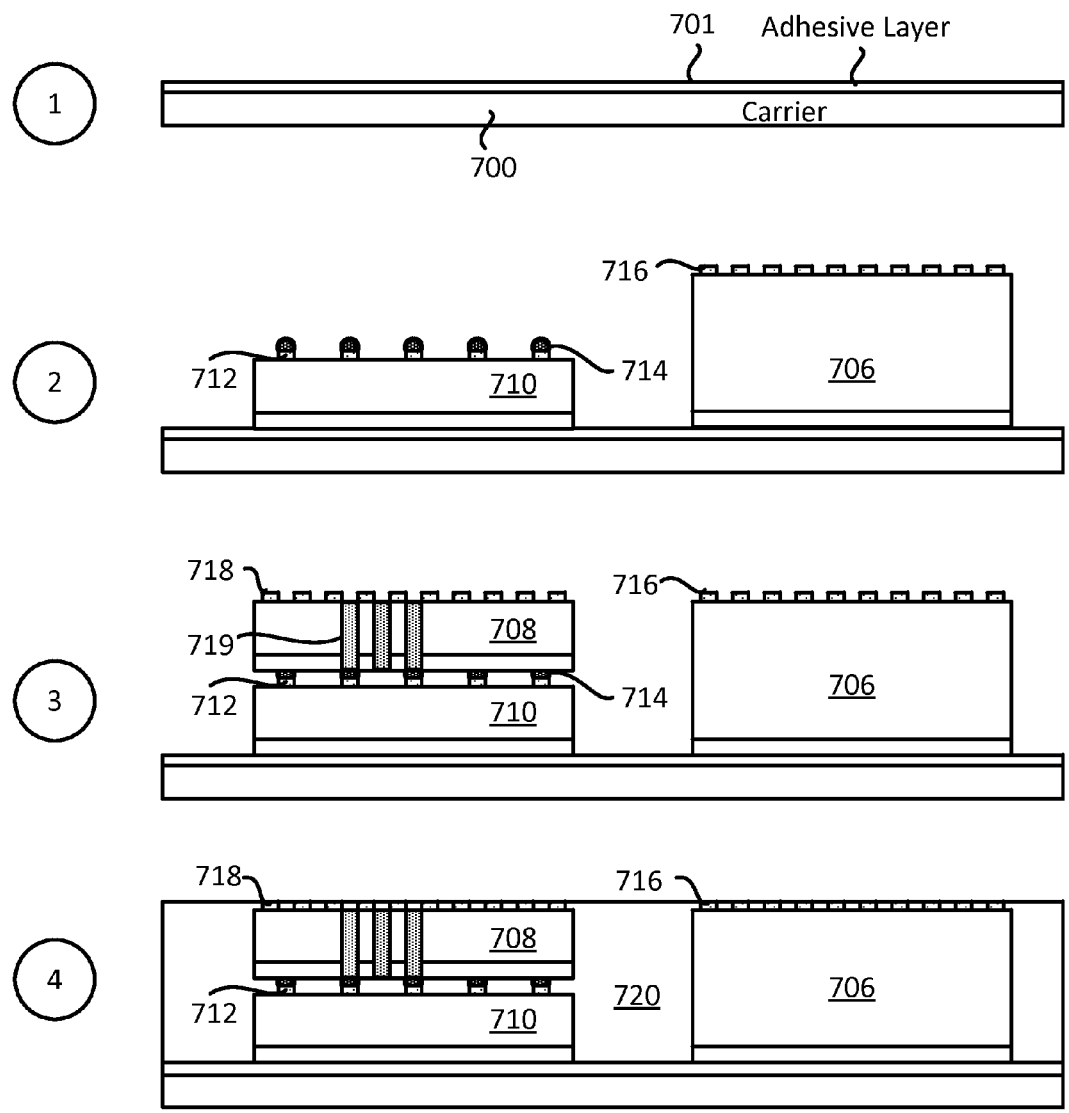
FIG. 7A illustrates part of an exemplary sequence for providing/manufacturing an integrated device that includes stacked dies.
Figure 7B:
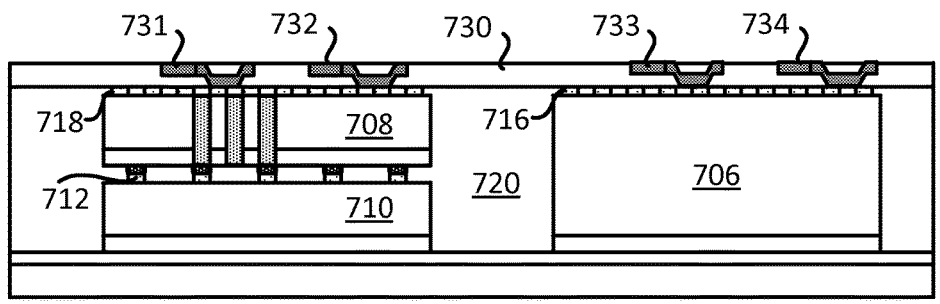
FIG. 7B illustrates part of an exemplary sequence for providing/manufacturing an integrated device that includes stacked dies.
Figure 7B:
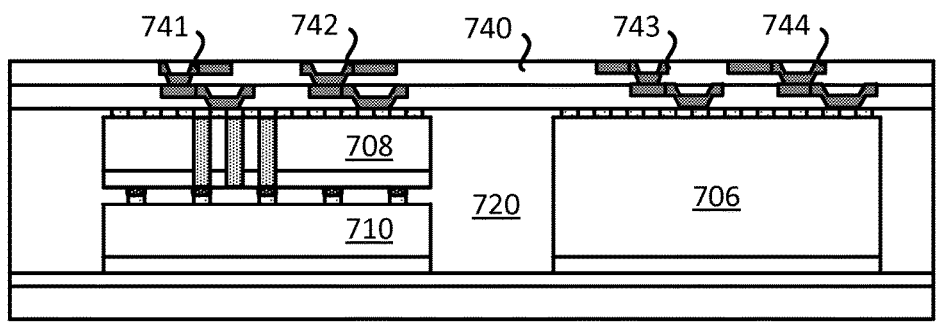
Figure 7B:
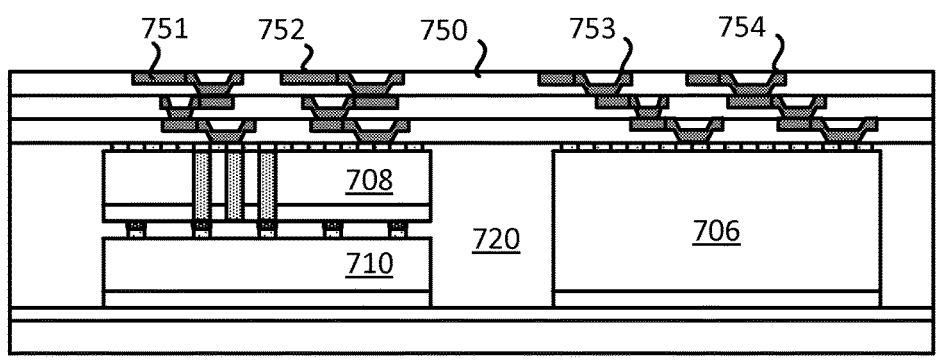
Figure 7C:
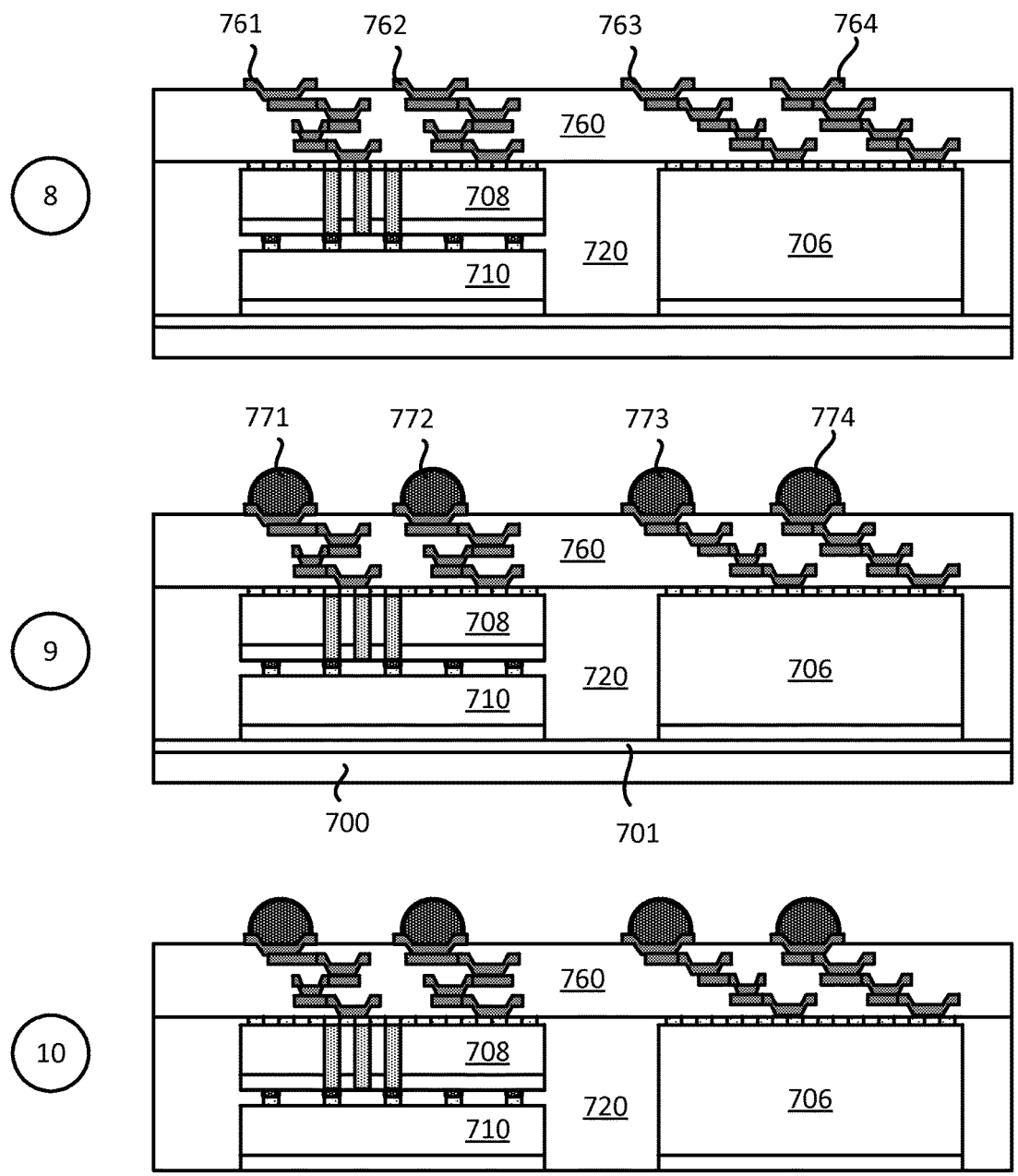
FIG. 7C illustrates part of an exemplary sequence for providing/manufacturing an integrated device that includes stacked dies.

Exemplary Sequence for Manufacturing an Integrated Device that Includes a Stacked Dies In some implementations, providing an integrated device (e.g., integrated package, wafer level integrated package device) that includes stacked dies includes several processes. FIGS. 7A-7C illustrate an exemplary sequence for providing an integrated device (e.g., manufacturing, fabricating). In some implementations, the sequence of FIGS. 7A-7C may be used to provide/manufacture/fabricate the integrated device of FIGS. 2 and/or 5-6, and/or other integrated devices described in the present disclose.

It should also be noted that the sequence of FIGS. 7A-7C may be used to provide/manufacture/fabricate integrated devices that also include circuit elements. It should further be noted that the sequence of FIGS. 7A-7C may combine one or more stages in order to simplify and/or clarify the sequence for providing an integrated device that includes stacked dies.

As shown in stage 1 of FIG. 7A, a carrier (e.g., carrier 700) and an adhesive layer (adhesive layer 701) is provided. The adhesive layer 701 is coupled to a surface of the carrier 700. In some implementations, the adhesive layer 701 is a glue material. In some implementations, the carrier 700 is a substrate. Different implementations may use different materials for the carrier 700 (e.g., silicon substrate, glass substrate, ceramic substrate).

At stage 2, several dies are provided on the adhesive layer 701 of the carrier 700. As shown in stage 2, a first die 706 and a second die 710 are provided on the adhesive layer 701. Specifically, the back side of the first die 706 and the back side of the second die 710 are coupled to the adhesive layer 701. The first die 706 includes a first set of interconnects 716. The second die 710 includes a second set of interconnects 712, and a set of solder balls 714. In some implementations, the dies (e.g., dies 706 and/or 710) are wafer level dies. The first set of interconnects 716 may include one of at least a pad, a redistribution portion, and/or pillars (e.g., copper pillars). The second set of interconnects 712 may include one of at least a pad, a redistribution portion, and/or pillars (e.g., copper pillars). Examples of dies are described in FIGS. 3-4.

At stage 3, a third die 708 is coupled to the second die 710. The third die 708 includes a third set of interconnects 718 and a set of through substrate vias (TSVs) 719. In some implementations, the third die 708 may be a wafer level die. Examples of dies are described in FIGS. 3-4. The third die 708 is coupled to the second die 710 such that the back side of the third die 708 is coupled to the front side (active side) of the second die 710. In some implementations, the second set of interconnects 712 and the set of solder balls 714 are electrically coupled to the set of TSVs 719. The set of TSVs 719 is electrically coupled to the third set of interconnects 718.

At stage 4, an encapsulation layer 720 is provided. The encapsulation material 720 substantially or completely surrounds or encapsulates the first die 706, the second die 710, and the third die 708. In some implementations, some of the interconnects (e.g., interconnects 716, 718) may be left exposed. Different implementations may use different materials for the encapsulation layer 720. For example, the encapsulation material may include one of at least a mold, a fill, an epoxy, and/or a polymer.

In some implementations, the encapsulation layer 720 may also encapsulate/cover all the interconnects (e.g., interconnects 716, 718). In such instances, portions of the encapsulation layer 720 may be removed (e.g., polished, grinded). In an example, portions of the encapsulation layer 720 is removed until the surface of the encapsulation 720 is aligned with the surface of the interconnects 716 and/or interconnects 718. In some implementations, portions of the interconnects 716 and 718 may also be removed (e.g., polished, grinded) to be aligned with the surface of the encapsulation layer 720.

At stage 5, as shown in FIG. 7B, a first dielectric layer 730 and several redistribution interconnects (e.g., redistribution interconnects 731-734) are provided on the active side (e.g., front side) of the first die 706 and the active side (e.g., front side) of the third die 708. Specifically, several interconnects are provided on the first set of interconnect 716 and the third set of interconnects 718. In some implementations, the redistribution interconnects 731-734 are formed on a first redistribution metal layer. In some implementations, the redistribution interconnects 731-734 may include at least one via.

At stage 6, a second dielectric layer 740 and several redistribution interconnects (e.g., redistribution interconnects 741-744) are provided on the first dielectric layer 730 and the redistribution interconnects 731-734. In some implementations, the redistribution interconnects 741-744 are formed on a second redistribution metal layer. In some implementations, the redistribution interconnects 741-744 may include at least one via.

At stage 7, a third dielectric layer 750 and several redistribution interconnects (e.g., redistribution interconnects 751-754) are provided on the second dielectric layer 740 and the redistribution interconnects 741-744. In some implementations, the redistribution interconnects 751-754 are formed on a third redistribution metal layer. In some implementations, the redistribution interconnects 751-754 may include at least one via.

At stage 8, as shown in FIG. 7C, at least one under bump metallization (UBM) layer is optionally provided. Specifically, a first under bump metallization (UBM) layer 761, a second UBM layer 762, a third UBM layer 763, and a fourth UBM layer 764 are provided. Stage 8 illustrates the set of dielectric layers 760. In some implementations, the set of dielectric layers 760 includes the dielectric layers 730, 740, and 750.

At stage 9, at least one solder ball is provided on the UBM layer. Specifically, a first solder ball 771 is coupled to the first UBM layer 761, a second solder ball 772 is coupled to the second UBM layer 762, a third solder ball 773 is coupled to the third UBM layer 763, and a fourth solder ball 774 is coupled to the fourth UBM layer 764. As described above, in some implementations, the UBM layers are optional. In such instances, the solder balls may be coupled to the set of redistribution interconnects.

At stage 10, a surface of the integrated device is removed (e.g., polished, grinded). Specifically, the carrier 700 and/or the adhesive layer 701 are removed (e.g., polished, grinded). In some implementations, a residual layer of the adhesive layer 701 may be left. In some implementations, a portion of the first die 706 and the second die 710 may be removed. That is, a portion of the back side of the first die 706 and the back side of the second die 710 may be removed. In some implementations, that means that a portion of the substrate of the first die 706 and/or a portion of the substrate of the second die 710 may be removed.

Having described a sequence for providing/manufacturing an integrated device (e.g., semiconductor device), a method for providing/manufacturing an integrated device (e.g., semiconductor device, wafer level integrated package device) will now be described below.

Exemplary Method for Manufacturing an Integrated Device

Figure 8:
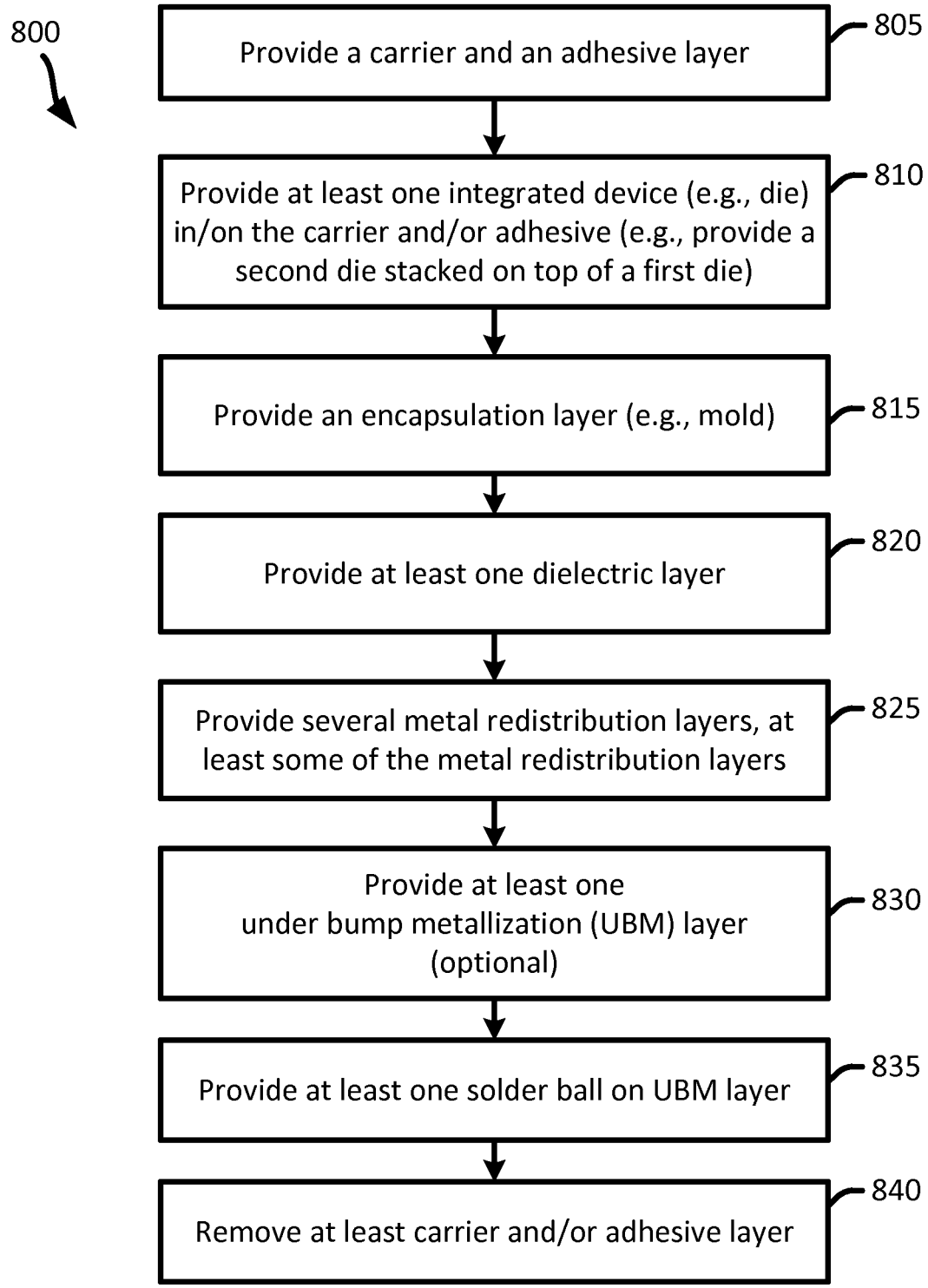
FIG. 8 illustrates an exemplary method for providing/manufacturing an integrated device that includes stacked dies.

FIG. 8 illustrates an exemplary method for providing (e.g., manufacturing, fabricating) an integrated device (e.g., integrated package). In some implementations, the method of FIG. 8 may be used to provide/manufacture/fabricate the integrated device of FIGS. 2 and/or 5-6, and/or other integrated devices (e.g., die package) described in the present disclose.

The method provides (at 805) a carrier (e.g., carrier 700) and an adhesive layer (e.g., adhesive layer 701). The adhesive layer is coupled to a surface of the carrier. In some implementations, the adhesive layer is a glue material. In some implementations, the carrier is a substrate. Different implementations may use different materials for the carrier (e.g., silicon substrate, glass substrate, ceramic substrate). In some implementations, providing the carrier and the adhesive layer include forming and/or manufacturing the carrier, manufacturing the adhesive layer, and coupling the adhesive layer to the carrier.

The method then provides (at 810) at least one integrated device (e.g., die) in or/and on the substrate. In some implementations, providing (at 810) at least one integrated device includes providing a first die on the carrier and/or the adhesive layer and providing a second die on the first die. In some implementations, providing at least one integrated device also includes providing a third die on the carrier and/or the adhesive layer and providing a fourth die on the third die. Examples of providing at least one die is shown in FIG. 7A (see e.g., stages 2-3). In some implementations, the dies that are provided are wafer level dies. In some implementations, providing the dies include manufacturing the dies and coupling (e.g., placing) the dies on the adhesive layer or another die. In some implementations, the back side of the dies are coupled (e.g., placed) on the adhesive layer or the active side (e.g., front side) of a die.

The method provides (at 815) an encapsulation layer. In some implementations, the encapsulation layer substantially or completely surrounds or encapsulates the dies (e.g., first die 706, the second die 710, and the third die 708). In some implementations, some of the interconnects (interconnects 716, 718) of the dies may be left exposed. Different implementations may use different materials for the encapsulation layer. In some implementations, the encapsulation layer is one of at least a mold, a fill, an epoxy, and/or a polymer.

The method further provides (at 820) at least one dielectric layer (e.g., dielectric layers 730, 740, 750, 760). Different implementations may use different materials for the dielectric layers. For example, first and second insulation layers (which are a form of a dielectric layer) may be a Polybenzoxazole (PbO) layer and/or a polymer layer. In some implementations, providing the at least one dielectric layer includes forming and/or depositing at least one dielectric layer.

The method also provides (at 825) several metal redistribution layers. In some implementations, providing several redistribution layers includes providing several redistribution interconnects (e.g., redistribution interconnects 731-734) and/or vias. It should be noted that in some implementations, the method of providing (at 820) at least one dielectric layer, and providing (at 825) the metal redistribution layers may be performed sequentially back and forth. That is, in some implementations, the method may provide a first dielectric layer, a first redistribution layer, a second dielectric layer, a second redistribution layer, and so on and so forth. In some implementations, providing the metal redistribution layers includes forming and/or depositing several metal redistribution layers.

The method then optionally provides (at 830) an under bump metallization (UBM) layer. In some implementations, providing (at 830) the UBM layer includes coupling the UBM layer to a metal redistribution layer. In some implementations, the UBM layer is a copper layer. In some implementations, providing the UBM layer includes forming and/or depositing a UBM layer.

The method further provides (at 835) a solder ball on the UBM layer. In some implementations, providing the solder ball includes coupling (e.g., depositing) the solder ball on the UBM layer. In some implementations, the UBM layers are optional. In such instances, the solder balls may be coupled to the set of redistribution layers.

The method further removes (at 840) at least a portion of the integrated device. In some implementations, removing at least a portion of the integrated device includes polishing and/or grinding a first surface of the integrated device. For example, a portion of the surface that includes the encapsulation layer may be removed through polishing and/or grinding. In some implementations, removing at least a portion of the integrated device includes removing at least a portion of the carrier and/or the adhesive layer. In some implementations, a residual layer of the adhesive layer may be left. In some implementations, a portion of the dies may be removed. That is, a portion of the back side of the dies may be removed. In some implementations, that means that a portion of the substrate of the dies may be removed. Stage 10 of FIG. 7C illustrates an example of removing a carrier, an adhesive layer, and/or an encapsulation layer.

Figure 9A:
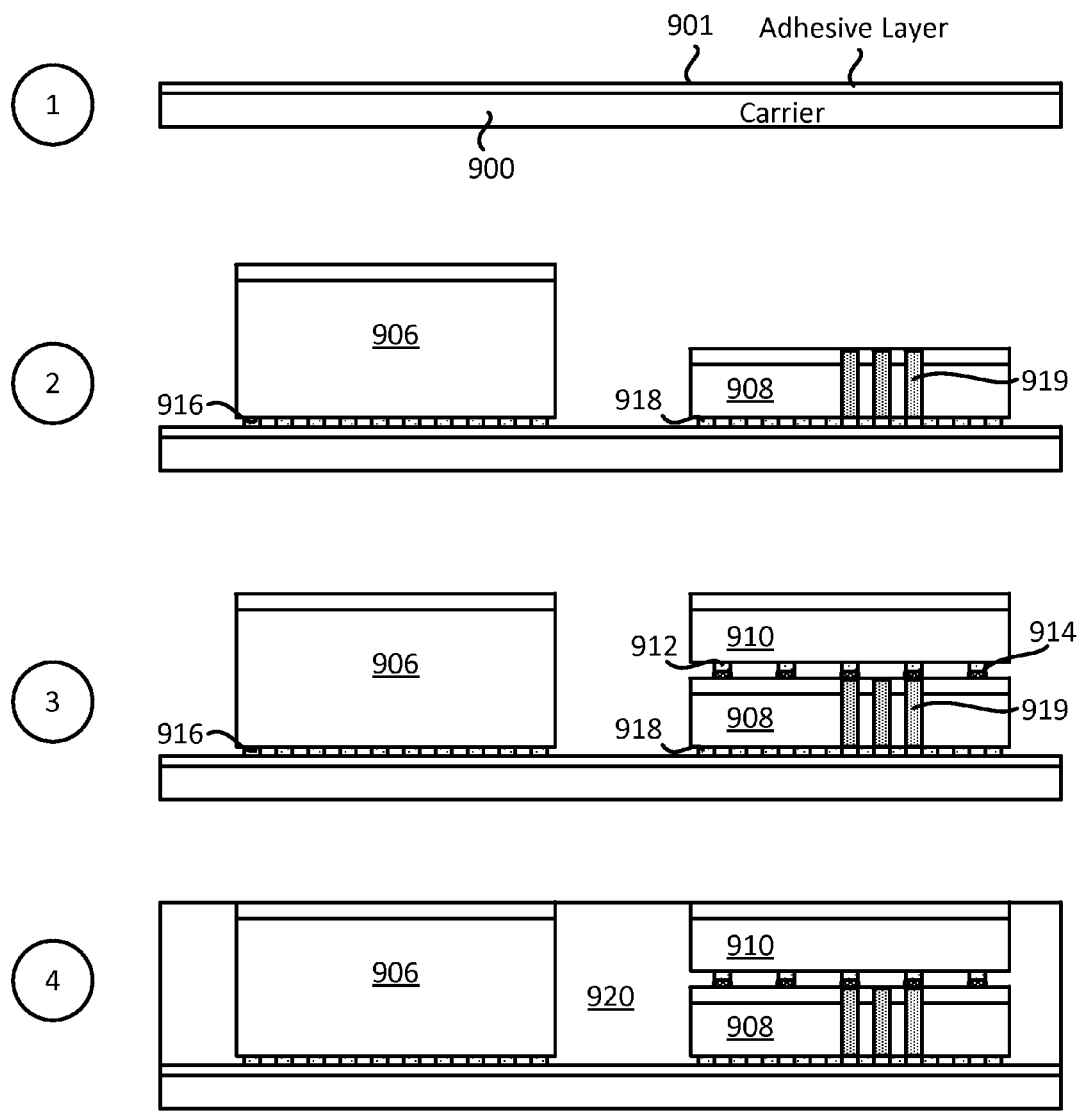
FIG. 9A illustrates part of an exemplary sequence for providing/manufacturing an integrated device that includes stacked dies.
Figure 9B:
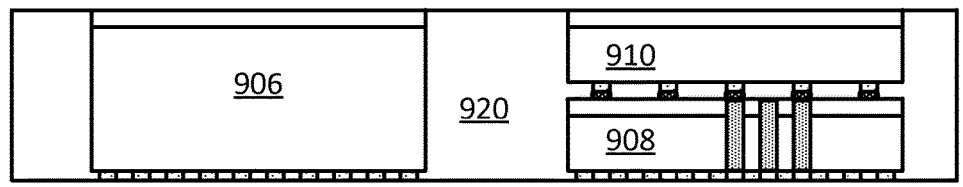
FIG. 9B illustrates part of an exemplary sequence for providing/manufacturing an integrated device that includes stacked dies.
Figure 9B:
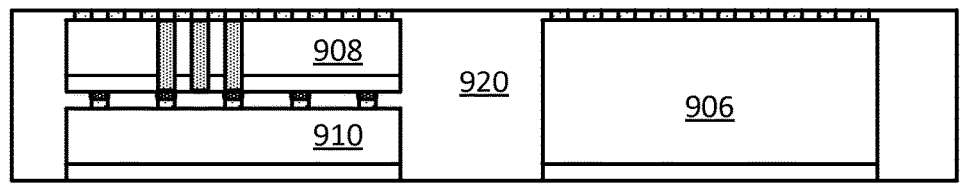
Figure 9B:
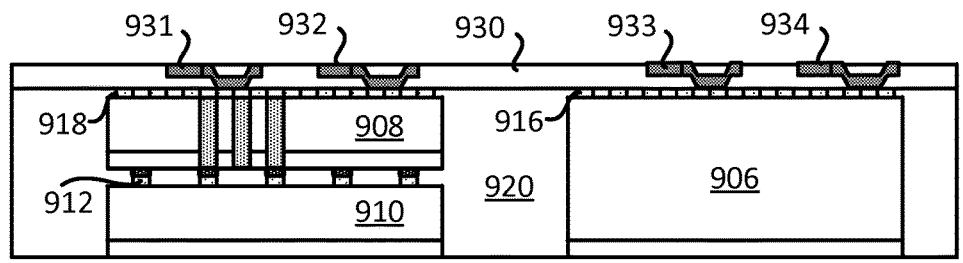
Figure 9B:
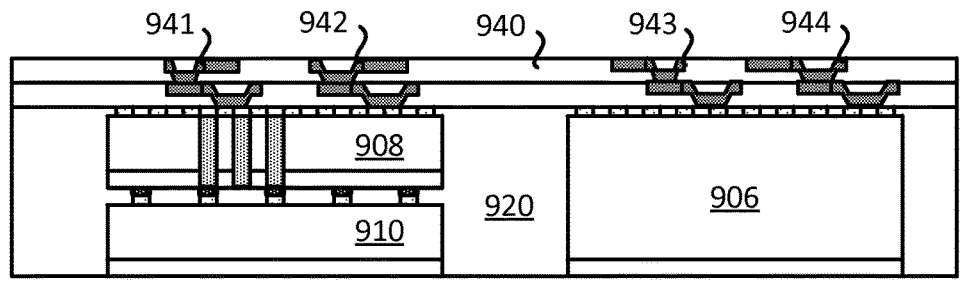
Figure 9C:
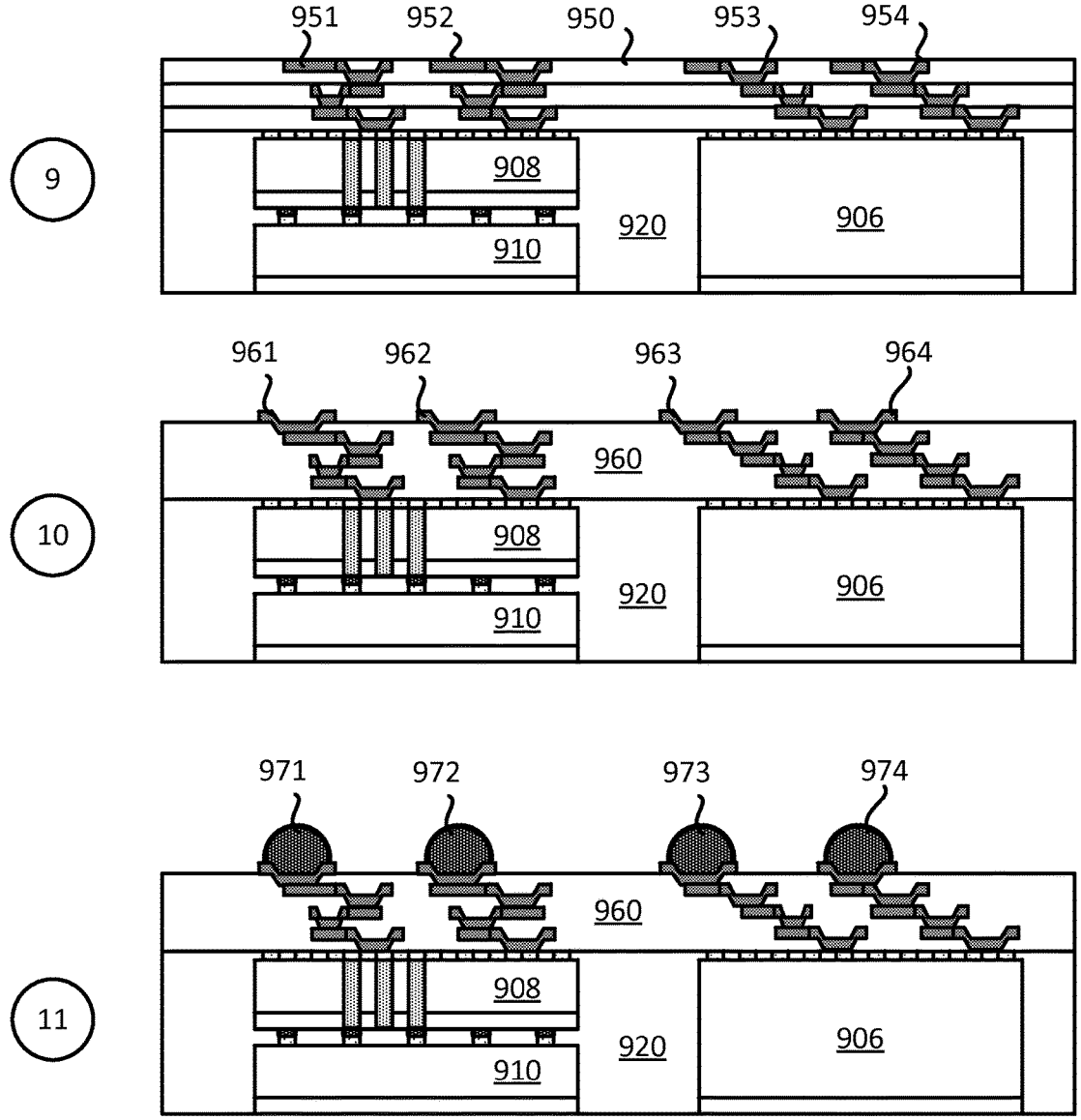
FIG. 9C illustrates part of an exemplary sequence for providing/manufacturing an integrated device that includes stacked dies.

Exemplary Sequence for Manufacturing an Integrated Device that Includes a Stacked Dies In some implementations, providing an integrated device (e.g., integrated package, wafer level integrated package device) that includes stacked dies includes several processes. FIGS. 9A-9C illustrate an exemplary sequence for providing (e.g., manufacturing, fabricating) an integrated device. In some implementations, the sequence of FIGS. 9A-9C may be used to provide/manufacture/fabricate the integrated device of FIGS. 2 and/or 5-6, and/or other integrated devices described in the present disclose.

It should also be noted that the sequence of FIGS. 9A-9C may be used to provide/manufacture/fabricate integrated devices that also include circuit elements. It should further be noted that the sequence of FIGS. 9A-9C may combine one or more stages in order to simplify and/or clarify the sequence for providing an integrated device that includes stacked dies.

As shown in stage 1 of FIG. 9A, a carrier (e.g., carrier 900) and an adhesive layer (adhesive layer 901) is provided. The adhesive layer 901 is coupled to a surface of the carrier 900. In some implementations, the adhesive layer 901 is a glue material. In some implementations, the carrier 900 is a substrate. Different implementations may use different materials for the carrier 900 (e.g., silicon substrate, glass substrate, ceramic substrate).

At stage 2, several dies are provided on the adhesive layer 901 of the carrier 900. As shown in stage 2, a first die 906 and a second die 910 are provided on the adhesive layer 901. Specifically, the active side (e.g., front side) of the first die 906 and the active side (e.g., front side) of the second die 908 are coupled to the adhesive layer 901. The first die 906 includes a first set of interconnects 916. The second die 908 includes a second set of interconnects 918 and a set of through substrate vias (TSVs) 919. In some implementations, the dies (e.g., dies 906 and/or 908) are wafer level dies. The first set of interconnects 916 may include one of at least a pad, a redistribution portion, and/or pillars (e.g., copper pillars). The second set of interconnects 918 may include one of at least a pad, a redistribution portion, and/or pillars (e.g., copper pillars). Examples of dies are described in FIGS. 3-4.

At stage 3, a third die 910 is coupled to the second die 908. The third die 910 includes a third set of interconnects 918 and a set of solder balls 914. In some implementations, the third die 910 may be a wafer level die. Examples of dies are described in FIGS. 3-4. The third die 910 is coupled to the second die 908 such that the front side (active side) of the third die 910 is coupled to the back side of the second die 908. In some implementations, the third set of interconnects 912 and the set of solder balls 914 are electrically coupled to the set of TSVs 919. The set of TSVs 919 is electrically coupled to the second set of interconnects 918.

At stage 4, an encapsulation layer 920 is provided. The encapsulation material 920 substantially or completely surrounds or encapsulates the first die 906, the second die 908, and the third die 910. Different implementations may use different materials for the encapsulation layer 920. For example, the encapsulation material may include one of at least a mold, a fill, an epoxy, and/or a polymer.

In some implementations, the encapsulation layer 920 may be greater than the first die 906 and/or the third die 910. In such instances, portions of the encapsulation layer 920 may be removed (e.g., polished, grinded). In an example, portions of the encapsulation layer 920 is removed until the surface of the encapsulation 920 is aligned with the surface of the first die 906 and/or the third die 910. In some implementations, portions of the first die 906 and/or the third die 910 may also be removed (e.g., polished, grinded) to be aligned with the surface of the encapsulation layer 920.

At stage 5, as shown in FIG. 9B, a surface of the integrated device is removed (e.g., polished, grinded). Specifically, the carrier 900 and/or the adhesive layer 901 are removed (e.g., polished, grinded). In some implementations, a residual layer of the adhesive layer 901 may be left. In some implementations, a portion of the first die 906 and the second die 908 may be removed. That is, a portion of the active side (e.g., front side) of the first die 906 and the active side (e.g., front side) of the second die 908 may be removed. In some implementations, that means that a portion of the first interconnects 916 and/or the second interconnects 918 may be removed.

At stage 6, the integrated device is flipped upside down, so that a redistribution portion/base portion may be formed on the mold 720 and dies.

At stage 7, a first dielectric layer 930 and several redistribution interconnects (e.g., redistribution interconnects 931-934) are provided on the active side (e.g., front side) of the first die 906 and the active side (e.g., front side) of the second die 908. Specifically, several interconnects are provided on the first set of interconnect 916 and the second set of interconnects 918. In some implementations, the redistribution interconnects 931-934 are formed on a first redistribution metal layer. In some implementations, the redistribution interconnects 931-934 may include at least one via.

At stage 8, a second dielectric layer 940 and several redistribution interconnects (e.g., redistribution interconnects 941-944) are provided on the first dielectric layer 930 and the redistribution interconnects 931-934. In some implementations, the redistribution interconnects 941-944 are formed on a second redistribution metal layer. In some implementations, the redistribution interconnects 941-944 may include at least one via.

At stage 9, as shown in FIG. 9C, a third dielectric layer 950 and several redistribution interconnects (e.g., redistribution interconnects 951-954) are provided on the second dielectric layer 940 and the redistribution interconnects 941-944. In some implementations, the redistribution interconnects 951-954 are formed on a third redistribution metal layer. In some implementations, the redistribution interconnects 951-954 may include at least one via.

At stage 10, at least one under bump metallization (UBM) layer is provided. Specifically, a first under bump metallization (UBM) layer 961, a second UBM layer 962, a third UBM layer 963, and a fourth UBM layer 964 are provided. Stage 10 illustrates the set of dielectric layers 960. In some implementations, the set of dielectric layers 960 includes the dielectric layers 930, 940, and 950.

At stage 11, at least one solder ball is provided on the UBM layer. Specifically, a first solder ball 971 is coupled to the first UBM layer 961, a second solder ball 972 is coupled to the second UBM layer 962, a third solder ball 973 is coupled to the third UBM layer 963, and a fourth solder ball 974 is coupled to the fourth UBM layer 964.

Having described a sequence for providing/manufacturing an integrated device (e.g., semiconductor device), a method for providing/manufacturing an integrated device (e.g., semiconductor device, wafer level integrated package device) will now be described below.

Exemplary Method for Manufacturing an Integrated Device

Figure 10:
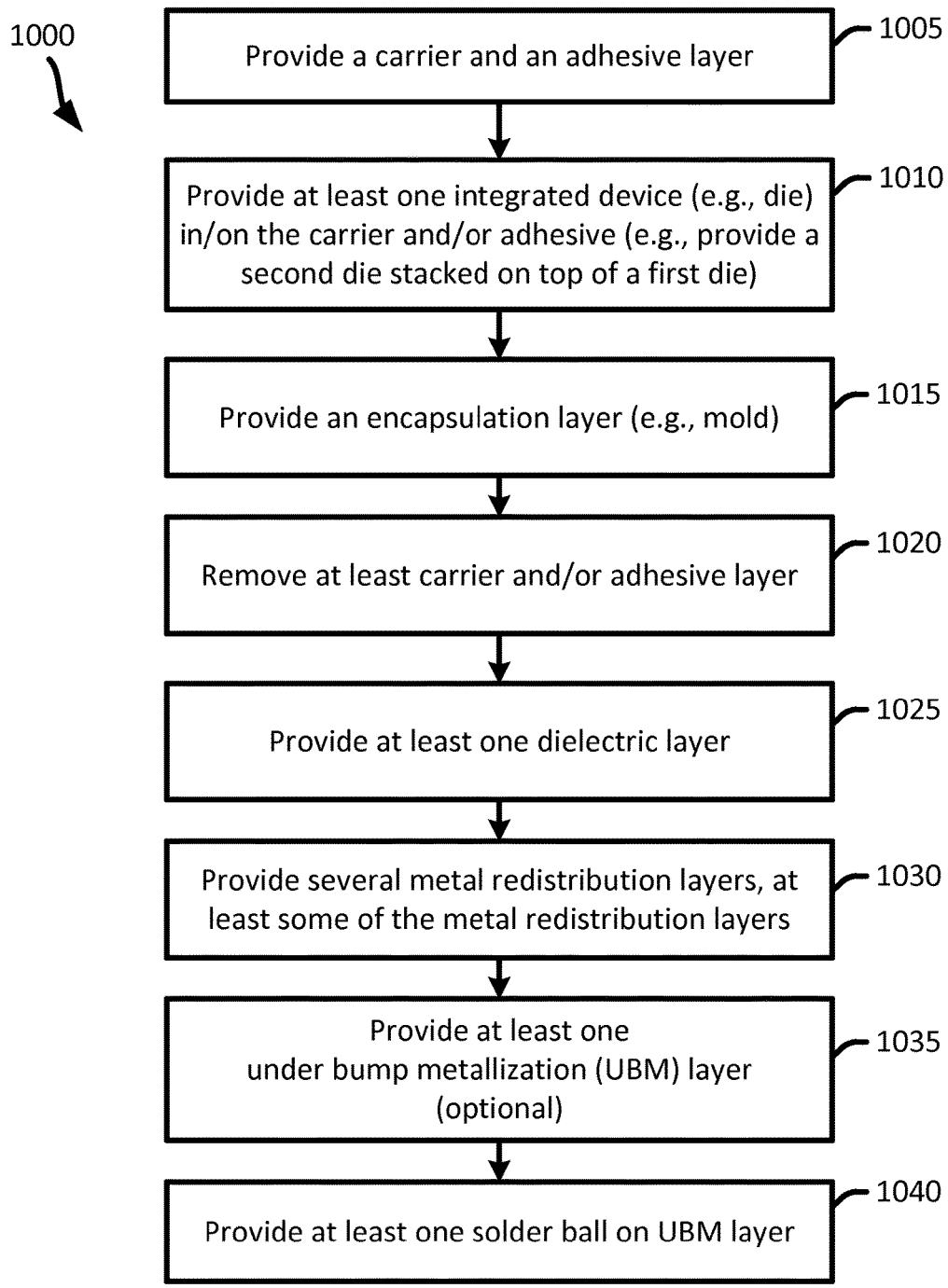
FIG. 10 illustrates an exemplary method for providing/manufacturing an integrated device that includes stacked dies.

FIG. 10 illustrates an exemplary method for providing (e.g., manufacturing, fabricating) an integrated device (e.g., integrated package). In some implementations, the method of FIG. 10 may be used to provide/manufacture/fabricate the integrated device of FIGS. 2 and/or 5-6, and/or other integrated devices (e.g., die package) described in the present disclose.

The method provides (at 1005) a carrier (e.g., carrier 900) and an adhesive layer (e.g., adhesive layer 901). The adhesive layer is coupled to a surface of the carrier. In some implementations, the adhesive layer is a glue material. In some implementations, the carrier is a substrate. Different implementations may use different materials for the carrier (e.g., silicon substrate, glass substrate, ceramic substrate). In some implementations, providing the carrier and the adhesive layer include forming and/or manufacturing the carrier, manufacturing the adhesive layer, and coupling the adhesive layer to the carrier.

The method then provides (at 1010) at least one integrated device (e.g., die) in or/and on the substrate. In some implementations, providing (at 1010) at least one integrated device includes providing a first die on the carrier and/or the adhesive layer and providing a second die on the first die. In some implementations, providing at least one integrated device also includes providing a third die on the carrier and/or the adhesive layer and providing a fourth die on the third die. Examples of providing at least one die is shown in FIG. 9A (see e.g., stages 2-3). In some implementations, the dies that are provided are wafer level dies. In some implementations, providing the dies include manufacturing the dies and coupling (e.g., placing) the dies on the adhesive layer or another die. In some implementations, the front side (e.g., active side) of the dies are coupled (e.g., placed) on the adhesive layer or the back side of a die.

The method provides (at 1015) an encapsulation layer. In some implementations, the encapsulation layer substantially or completely surrounds or encapsulates the dies (e.g., first die 906, the second die 908, and the third die 910). Different implementations may use different materials for the encapsulation layer. In some implementations, the encapsulation layer is one of at least a mold, a fill, an epoxy, and/or a polymer.

The method further removes (at 1020) at least a portion of the integrated device. In some implementations, removing at least a portion of the integrated device includes polishing and/or grinding a first surface of the integrated device. For example, a portion of the surface that includes the encapsulation layer may be removed through polishing and/or grinding. In some implementations, removing at least a portion of the integrated device includes removing at least a portion of the carrier and/or the adhesive layer. In some implementations, a residual layer of the adhesive layer may be left. In some implementations, a portion of the dies may be removed. That is, a portion of the front side (e.g., active side) of the dies may be removed. In some implementations, that means that a portion of the interconnects (e.g., interconnects 916 and 918) may be removed. Stage 5 of FIG. 9B illustrates an example of removing a carrier, an adhesive layer, and/or an encapsulation layer.

The method further provides (at 1025) at least one dielectric layer (e.g., dielectric layers 930, 940, 950, 960). Different implementations may use different materials for the dielectric layers. For example, first and second insulation layers (which are a form of a dielectric layer) may be a Polybenzoxazole (PbO) layer and/or a polymer layer. In some implementations, providing the at least one dielectric layer includes forming and/or depositing at least one dielectric layer. In some implementations, the dielectric layer is provided after the integrated device is flipped (as shown for example in Stage 6 of FIG. 9B).

The method also provides (at 1030) several metal redistribution layers. In some implementations, providing several redistribution layers includes providing several redistribution interconnects (e.g., redistribution interconnects 931-934) and/or vias. It should be noted that in some implementations, the method of providing (at 1025) at least one dielectric layer, and providing (at 1030) the metal redistribution layers may be performed sequentially back and forth. That is, in some implementations, the method may provide a first dielectric layer, a first redistribution layer, a second dielectric layer, a second redistribution layer, and so on and so forth. In some implementations, providing the metal redistribution layers includes forming and/or depositing several metal redistribution layers.

The method then optionally provides (at 1035) an under bump metallization (UBM) layer. In some implementations, providing (at 1035) the UBM layer includes coupling the UBM layer to a metal redistribution layer. In some implementations, the UBM layer is a copper layer. In some implementations, providing the UBM layer includes forming and/or depositing a UBM layer.

The method further provides (at 1040) a solder ball on the UBM layer. In some implementations, providing the solder ball includes coupling (e.g., depositing) the solder ball on the UBM layer. In some implementations, the UBM layers are optional. In such instances, the solder balls may be coupled to the set of redistribution layers.

Exemplary Sequence for Manufacturing Redistribution Layers

Figure 11A:
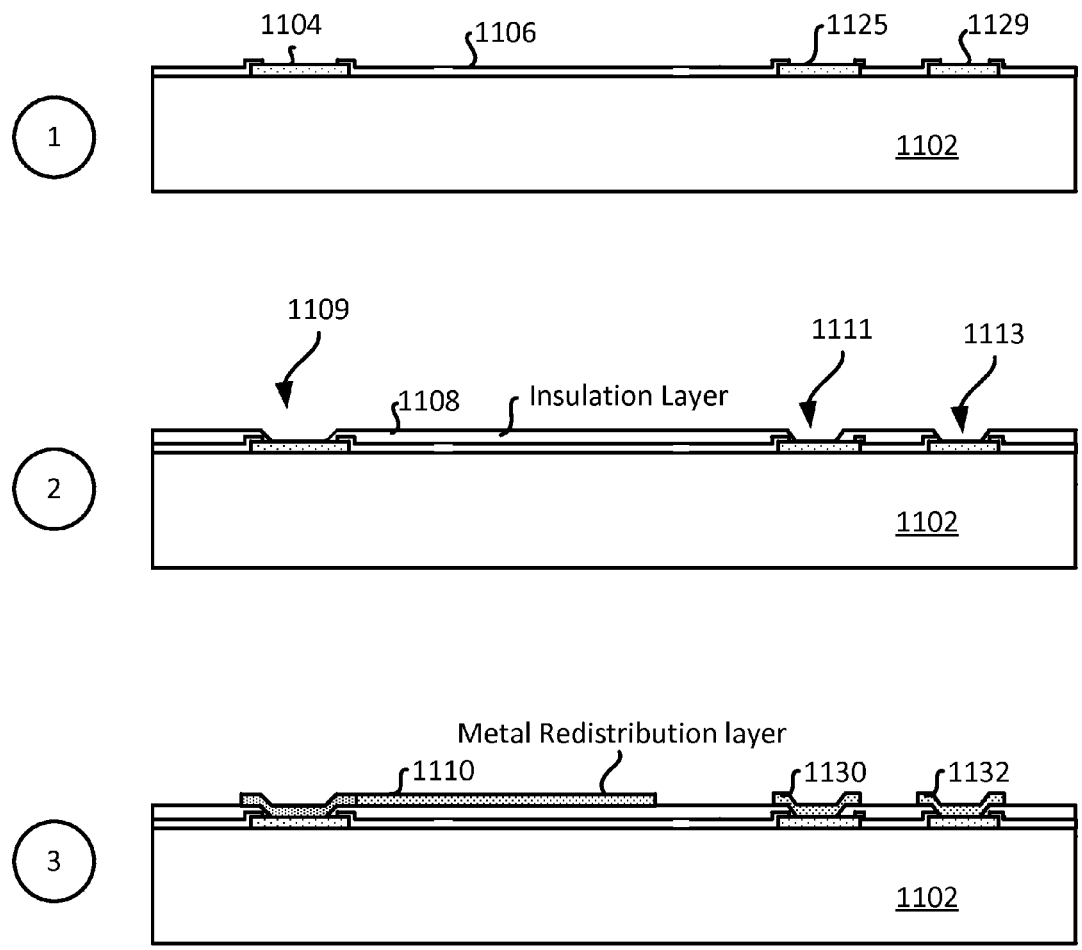
FIG. 11A illustrates part of an exemplary sequence for providing/manufacturing a redistribution layer.
Figure 11B:
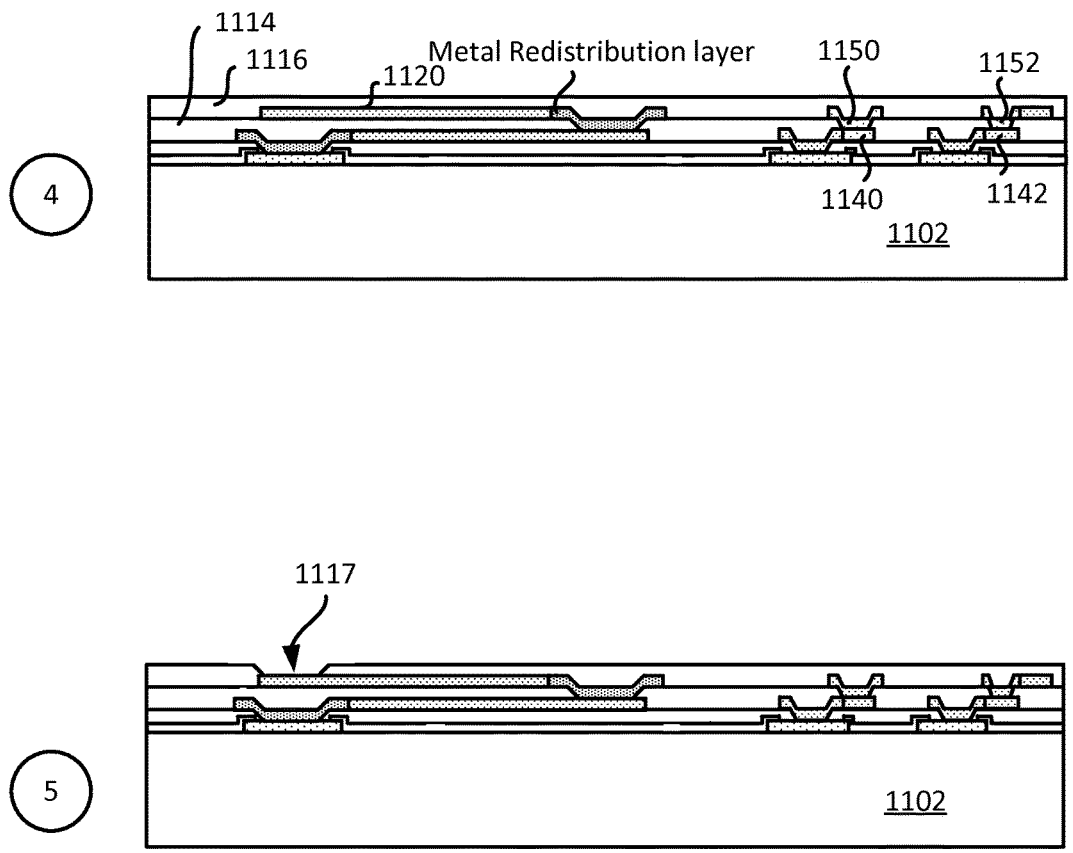
FIG. 11B illustrates part of an exemplary sequence for providing/manufacturing a redistribution layer.
Figure 11C:
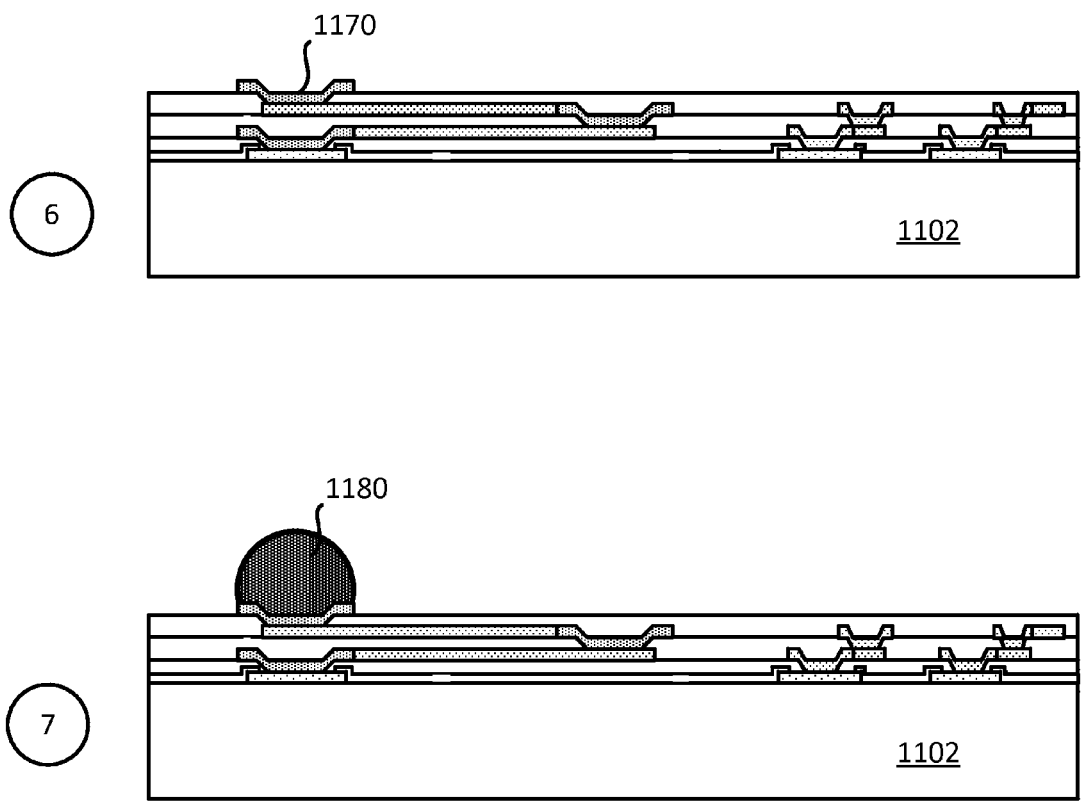
FIG. 11C illustrates part of an exemplary sequence for providing/manufacturing a redistribution layer.

In some implementations, providing (e.g., manufacturing, fabricating) an integrated device that includes redistribution layers includes several processes. FIGS. 11A-11C illustrate an exemplary sequence for providing an integrated device that includes several redistribution layers. In some implementations, the sequence of FIGS. 11A-11C may be used to provide/manufacture/fabricate the integrated device of FIGS. 2-6, and/or other integrated devices (e.g., dies, integrated devices) described in the present disclose.

It should also be noted that the sequence of FIGS. 11A-11C may be used to provide/manufacture/fabricate integrated devices that also include circuit elements. It should further be noted that the sequence of FIGS. 11A-11C may combine one or more stages in order to simplify and/or clarify the sequence for providing an integrated device that includes redistribution layers. FIGS. 11A-11C a more specific process for providing one or more redistribution layers.

As shown in stage 1 of FIG. 11A, a base portion 1102 is provided. The base portion 1102 may represent a die (e.g., wafer level die) or one or more dies encapsulated by an encapsulation layer. Moreover, at stage 1, at least one pad (e.g., pads 1104, 1125, 1129) is provided on the base portion 1102. In some implementations, the base portion 1102 includes lower level metal layers and dielectric layers (e.g., layers 302 or 402) of a die (e.g., die 300 or 400). In some implementations, the pad 1104 is coupled to one of the lower level metal layer (e.g., the top lower level metal layer, M7 metal layer) of the die. In some implementations, the pad 1104 is an aluminum pad. However, different implementations may use different materials for the pad 1104. In some implementations, the pad may be electrically coupled to lower level metal layers and dielectric layers of a die. Different implementations may use different processes for providing the pad. For example, in some implementations, a lithography and/or etching process may be use to provide the pad 1104.

Additionally, at stage 1, a passivation layer (e.g., passivation layer 1106) is provided on the base portion 1102. Different implementations may use different materials for the passivation layer 1106. In some implementations, the passivation layer is at least one of a dielectric, a mold, a polymer, and/or epoxy. As shown in stage 4, the passivation layer 1106 is provided on the base portion 1102 such that at least a portion of the pad 1104 is exposed.

At stage 2, a first insulation layer (e.g., first insulation layer 1108) is provided on the passivation layer 1106 and the pads 1104, 1125 and 1129. In some implementations, the first insulation layer 1108 is a dielectric layer. Different implementations may use different materials for the first insulation layer 1108. For example, the first insulation layer 1108 may be a Polybenzoxazole (PbO) layer or a polymer layer.

At stage 2, several cavities (e.g., cavity 1209, trench) are also provided/created in the first insulation layer 1108. As further shown in stage 3, the cavity 1109 is created over the pad 1104. Similarly, a cavity 1111 is created over the pad 1125, and a cavity 1113 is created over the pad 1129. Different implementations may create the cavities (e.g., cavity 1109) differently. For example, the cavity 1109 may be provided/created by etching the first insulation layer 1108.

At stage 3, a first metal redistribution layer is provided. Specifically, a first metal redistribution layer 1110 is provided over the pad 1104 and the first insulation layer 1108. As shown in stage 4, the first metal redistribution layer 1110 is coupled to the pad 1104. The first metal redistribution layer 1110 also includes a first metal layer 1130 and a second metal layer 1132. That is, in some implementations, the first metal layer 1130 and the second metal layer 1132 are on the same layer as the first metal redistribution layer 1110. In some implementations, the first and second metal layers 1120 and 1130 are vias. In some implementations, the first metal redistribution layer 1110 is a copper layer.

At stage 4 of FIG. 11B, several insulation layers and several redistribution layers are provided. Specifically, a second insulation layer 1114 and a third insulation layer

1116 are provided. Moreover, a second metal redistribution layer 1120 is provided. In addition, several metal layers (1140, 1150, 1142, 1152) are provided. In some implementations, the metal layers are part of the redistribution layers. In some implementations, some of the metal layers include vias. For example, metal layers 1142, and 1152 are vias and metal layers 1140 and 1150, are traces in some implementations.

At stage 5, a cavity 1117 is provided in the insulation layer 1116. The cavity 1117 in the insulation layer 1116 is over a portion of the interconnect 1120.

At stage 6 of FIG. 11C, an under bump metallization (UBM) layer is optionally provided. Specifically, an under bump metallization (UBM) layer 1170 is provided in the cavity 1117 of the insulation layer 1116. In some implementations, the UBM layer 1170 is a copper layer.

At stage 7, a solder ball is provided on the UBM layer. Specifically, a solder ball 1180 is coupled to the UBM layer 1170. In some implementations, the UBM layers are optional. In such instances, the solder balls may be coupled to the set of redistribution layers.

Exemplary Electronic Devices

Figure 12:
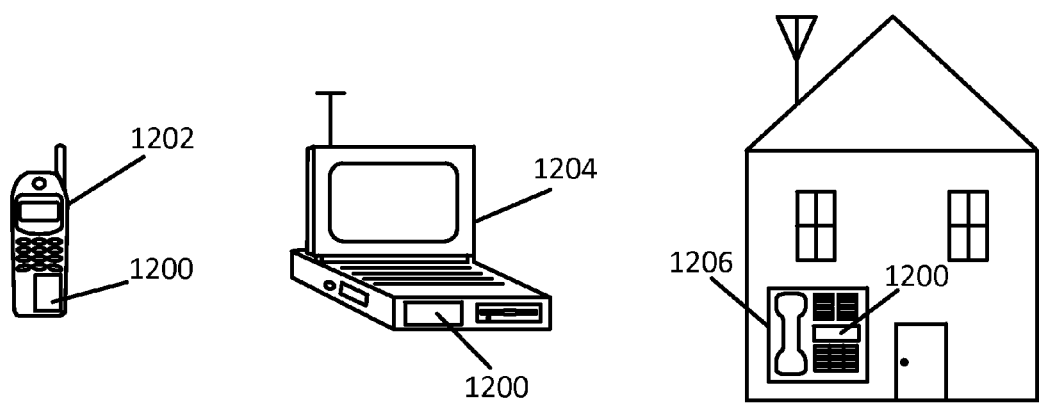
FIG. 12 illustrates various electronic devices that may integrate a semiconductor device, a die, an integrated circuit and/or PCB described herein.

FIG. 12 illustrates various electronic devices that may be integrated with any of the aforementioned semiconductor device, integrated circuit, die, interposer or package. For example, a mobile telephone 1202, a laptop computer 1204, and a fixed location terminal 1206 may include an integrated circuit (IC) 1200 as described herein. The IC 1200 may be, for example, any of the integrated circuits, dice or packages described herein. The devices 1202, 1204, 1206 illustrated in FIG. 12 are merely exemplary. Other electronic devices may also feature the IC 1200 including, but not limited to, mobile devices, hand-held personal communication systems (PCS) units, portable data units such as personal digital assistants, GPS enabled devices, navigation devices, set top boxes, music players, video players, entertainment units, fixed location data units such as meter reading equipment, communications devices, smartphones, tablet computers or any other device that stores or retrieves data or computer instructions, or any combination thereof.

One or more of the components, steps, features, and/or functions illustrated in FIGS. 2, 3, 4, 5, 6, 7A-7C, 8, 9A-9C, 10, 11A-11C, and/or 12 may be rearranged and/or combined into a single component, step, feature or function or embodied in several components, steps, or functions. Additional elements, components, steps, and/or functions may also be added without departing from the invention. It should also be noted that FIGS. 2, 3, 4, 5, 6, 7A-7C, 8, 9A-9C, 10, 11A-11C, and/or 12 and its corresponding description in the present disclosure is not limited to dies and/or ICs. In some implementations, 2, 3, 4, 5, 6, 7A-7C, 8, 9A-9C, 10, 11A-11C, and/or 12 and its corresponding description may be used to fabricate, manufacture, create, provide, and/or produce integrated devices. In some an integrated device may include a die package, an integrated circuit (IC), integrated package device, a wafer, and/or a semiconductor device.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another—even if they do not directly physically touch each other.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed.

The various features of the invention described herein can be implemented in different systems without departing from the invention. It should be noted that the foregoing aspects of the disclosure are merely examples and are not to be construed as limiting the invention. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. An integrated device comprising:
    a dielectric layer configured as a base for the integrated device;
    a plurality of redistribution metal layers in the dielectric layer;
    a first wafer level die coupled to a first surface of the dielectric layer, wherein the first wafer level die comprises at least one through substrate vias (TSVs);
    a second wafer level die coupled to the first wafer level die, wherein the second wafer level die is coupled to the plurality of redistribution metal layers through a first set of interconnects adjacent to the dielectric layer and further wherein the first set of interconnects are metal pillars, wherein the second wafer level die is further coupled to the plurality of redistribution metal layers through the at least one through substrate vias of the first wafer level die, a second set of interconnects, and a set of solder balls, wherein the second set of interconnects are metal pillars; and
    a third wafer level die coupled to the first surface of dielectric layer through a third set of interconnects wherein third set of interconnects are metal pillars and the third set of interconnects are vertically longer than the first set of interconnects.

2. The integrated device of claim 1, wherein the dielectric layer comprises several dielectric layers.

3. The integrated device of claim 1, wherein the first wafer level die is coupled to the plurality of redistribution metal layers through the first set of interconnects.

4. The integrated device of claim 1, wherein the second wafer level die is vertically coupled to the first wafer level die through the second set of interconnects, and the set of solder balls.

5. The integrated device of claim 1, further comprising an encapsulation layer that encapsulates the first wafer level die and the second wafer level die.

6. The integrated device of claim 1, wherein the first wafer level die is a processor and the second wafer level die is a memory die.

7. The integrated device of claim 1, wherein the integrated device is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

8. The apparatus of claim 1, wherein the first wafer level die is a processor and the second wafer level die is a memory die.

9. An apparatus comprising:
a dielectric layer configured as a base for the integrated device;
a redistribution interconnect means in the dielectric layer;
a first wafer level die coupled to a first surface of the dielectric layer, wherein the first wafer level die comprises at least one through substrate vias (TSVs);
a second wafer level die coupled to the first wafer level die, wherein the second wafer level die is coupled to the redistribution interconnect means through a first set of interconnects adjacent to the dielectric layer and further wherein the first set of interconnects are metal pillars, wherein the second wafer level die is further coupled to the plurality of redistribution metal layers through the at least one through substrate via of the first wafer level die, a second set of interconnects, and a set of solder balls, wherein the second set of interconnects are metal pillars; and
a third wafer level die coupled to the first surface of dielectric layer through a third set of interconnects wherein third set of interconnects are metal pillars and the third set of interconnects are vertically longer than the first set of interconnects.

10. The apparatus of claim 9, wherein the dielectric layer comprises several dielectric layers.

11. The apparatus of claim 9, wherein the first wafer level die is coupled to the redistribution interconnect means through the first set of interconnects.

12. The apparatus of claim 9, wherein the second wafer level die is vertically coupled to first wafer level die through the second set of interconnects, and the set of solder balls.

13. The apparatus of claim 9, further comprising an encapsulation means that encapsulates the first wafer level die and the second wafer level die.

14. The apparatus of claim 9, wherein the apparatus is incorporated into at least one of a music player, a video player, an entertainment unit, a navigation device, a communications device, a mobile device, a mobile phone, a smartphone, a personal digital assistant, a fixed location terminal, a tablet computer, and/or a laptop computer.

* * * * *